United States Patent
Hyun

(10) Patent No.: US 7,800,201 B2
(45) Date of Patent: Sep. 21, 2010

(54) THINNED WAFER HAVING STRESS DISPERSION PARTS AND METHOD FOR MANUFACTURING SEMICONDUCTOR PACKAGE USING THE SAME

(75) Inventor: Sung Ho Hyun, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 226 days.

(21) Appl. No.: 12/043,478

(22) Filed: Mar. 6, 2008

(65) Prior Publication Data

US 2009/0001520 A1 Jan. 1, 2009

(30) Foreign Application Priority Data

Jun. 26, 2007 (KR) ...................... 10-2007-0063263

(51) Int. Cl.
*H01L 29/06* (2006.01)
(52) U.S. Cl. .................. 257/623; 257/622; 257/657; 438/42; 438/700; 438/795; 451/41; 451/63
(58) Field of Classification Search .................. 257/622, 257/623, 657; 438/42, 700, 795; 451/41, 451/63
See application file for complete search history.

(56) References Cited

U.S. PATENT DOCUMENTS

| | | | | | |
|---|---|---|---|---|---|
| 5,740,953 | A | * | 4/1998 | Smith et al. | 225/2 |
| 7,524,235 | B2 | * | 4/2009 | Liu et al. | 451/41 |
| 2007/0298690 | A1 | * | 12/2007 | Liu et al. | 451/48 |
| 2009/0283761 | A1 | * | 11/2009 | Hammer et al. | 257/43 |

FOREIGN PATENT DOCUMENTS

| | | |
|---|---|---|
| JP | 2005-251961 A | 9/2005 |
| KR | 1020010013658 A | 2/2001 |
| KR | 1020010027048 A | 4/2001 |
| KR | 1020020061737 A | 7/2002 |
| KR | 1020060085848 A | 7/2006 |
| KR | 1020080014653 A | 2/2008 |

* cited by examiner

*Primary Examiner*—Fernando L Toledo
(74) *Attorney, Agent, or Firm*—Ladas & Parry LLP

(57) ABSTRACT

A thinned wafer having stress dispersion parts that make the wafer resistant to warpage and a method for manufacturing a semiconductor package using the same is described. The wafer includes a wafer body having a semiconductor chip forming zone and a peripheral zone located around the semiconductor chip forming zone; and the stress dispersion parts are located in the peripheral zone so as to disperse stress induced in the peripheral zone and the semiconductor chip forming zone.

14 Claims, 7 Drawing Sheets

THINNED WAFER HAVING STRESS DISPERSION PARTS AND METHOD FOR MANUFACTURING SEMICONDUCTOR PACKAGE USING THE SAME

CROSS-REFERENCE TO RELATED APPLICATIONS

The present application claims priority to Korean patent application number 10-2007-0063263 filed on Jun. 26, 2007, which is incorporated herein by reference in its entirety.

BACKGROUND OF THE INVENTION

The present invention relates to a wafer and a method for manufacturing a semiconductor package using the same.

These days, with the development of semiconductor manufacturing technologies, semiconductor devices suitable for processing a large amount of data within a short time have been disclosed in the art.

Semiconductor devices are manufactured through a semiconductor chip manufacturing process for manufacturing semiconductor chips on a silicon wafer made of silicon having high purity, a die sorting process for electrically inspecting the semiconductor chips, and a packaging process for packaging good quality semiconductor chips.

Recently, a chip scale package, in which the size of a semiconductor package manufactured through the packaging process is no greater than about 100% to 110% of the size of a semiconductor chip, and a stacked semiconductor package, in which a plurality of semiconductor chips are stacked so as to increase the capacity and the processing speed of the package, have been developed.

The technical targets of the chip scale package and the stacked semiconductor package are to improve performances and reduce volumes.

In order to improve the performances and reduce the volumes of the chip scale package and the stacked semiconductor package, after forming semiconductor chips on a wafer through a semiconductor chip manufacturing process, a grinding process is frequently implemented to grind down the rear surface of the wafer so as to decrease the thickness of the semiconductor chips.

FIG. 1 is a photograph illustrating a conventional wafer which is formed with semiconductor chips and is thinned on the rear surface thereof.

Referring to FIG. 1, when the rear surface of the wafer is ground down to decrease the thickness of the wafer formed with the semiconductor chips, stress is induced in the wafer in the course of implementing the grinding process, and the wafer having a decreased thickness is prone to be warped or twisted due to this induced stress.

Also, when shocks and/or vibrations are applied to the wafer with stress excessively induced in the wafer, cracks can occur in the wafer and/or the wafer can break.

SUMMARY OF THE INVENTION

Embodiments of the present invention are directed to a wafer which can prevent or at least minimize the occurrence of cracks and/or the breakage thereof due to warpage or twisting by the stress induced through a grinding process, etc.

Other embodiments of the present invention are directed to a method for manufacturing a semiconductor package using the wafer.

One embodiment of the wafer of the present invention comprises a wafer body having a semiconductor chip forming zone and a peripheral zone which is located around the semiconductor chip forming zone; and having stress dispersion parts located in the peripheral zone so as to disperse stress induced in the peripheral zone and the semiconductor chip forming zone.

The stress dispersion parts comprise openings which are defined to be concave from an edge of the peripheral zone toward the semiconductor chip forming zone.

The stress dispersion parts have the sectional shape of a 'V' having a pointed end, when viewed from the top.

The stress dispersion parts have the sectional shape of a 'U' having a rounded end, when viewed from the top.

The stress dispersion parts are located at substantially regular intervals along the peripheral zone.

A thickness of the wafer body of the wafer can be 300 μm to 1,000 μm or 30 μm to 100 μm.

The stress dispersion parts comprise recesses which are defined to be concave from an edge of the peripheral zone toward the semiconductor chip forming zone.

The recesses are defined on a first surface and a second surface, facing away from the first surface, of the wafer body to be aligned up and down.

The stress dispersion parts are located along the peripheral zone and comprise 2 to 10 stress dispersion parts.

The semiconductor chip forming zone of the wafer has semiconductor chips.

One embodiment of a method of the present invention for manufacturing a semiconductor package comprises the steps of preparing a wafer by forming stress dispersion parts for dispersing stress induced in a wafer body, in a peripheral zone of the wafer body which has a semiconductor chip forming zone and the peripheral zone formed around the semiconductor chip forming zone; manufacturing a semiconductor chip by parting the semiconductor chip forming zone from the wafer body; and packaging the semiconductor chip.

Between the step of forming the stress dispersion parts and the step of parting the semiconductor chip, the method may further comprise the step of grinding a rear surface of the wafer body. The stress dispersion parts have the sectional shape of a 'V' or a 'U' when viewed from the top.

In the step of forming the stress dispersion parts, the stress dispersion parts are formed at substantially regular intervals along the peripheral zone.

The step of forming the stress dispersion parts includes the step of defining openings which are concave from an edge of the peripheral zone toward the semiconductor chip forming zone.

The step of forming the stress dispersion parts includes the step of defining recesses which are concave from an edge of the peripheral zone toward the semiconductor chip forming zone.

DESCRIPTION OF SPECIFIC EMBODIMENTS

Figure 2:
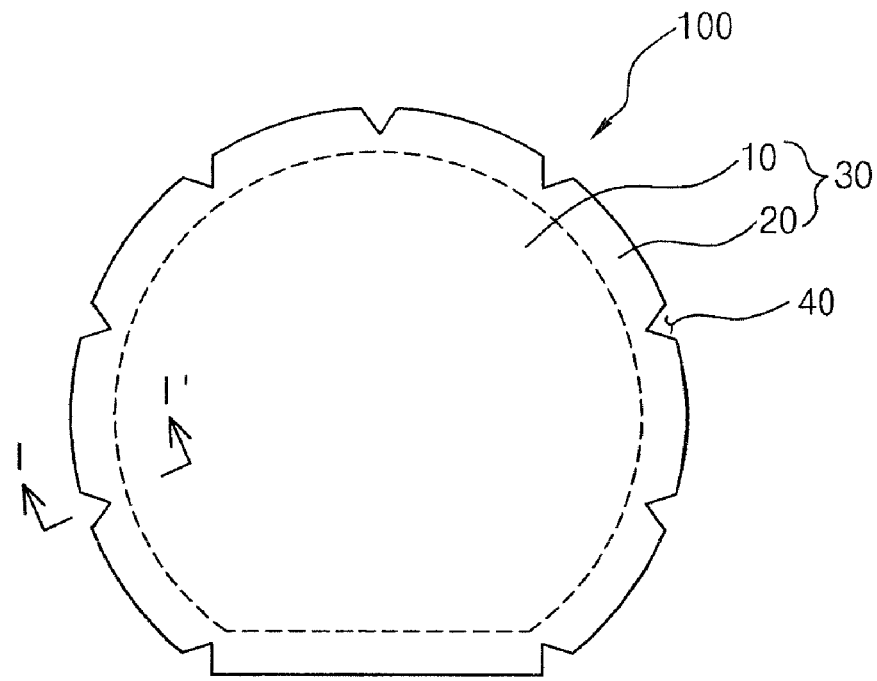
FIG. 2 is a plan view illustrating a wafer in accordance with an embodiment of the present invention.
Figure 3:
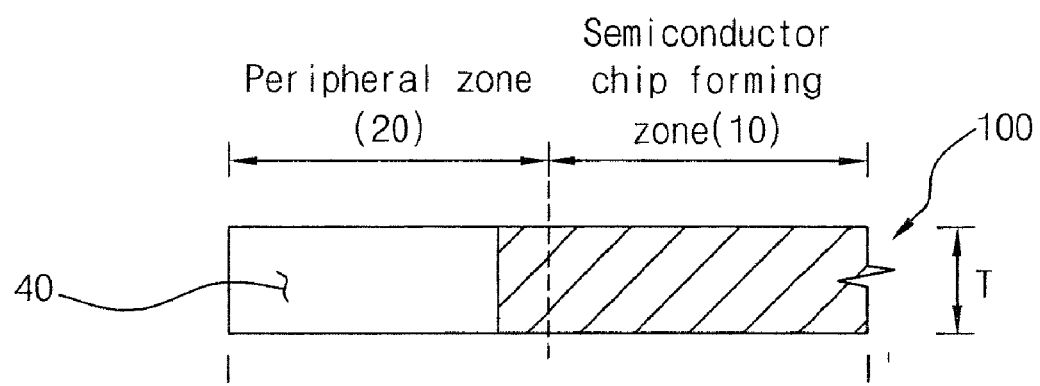
FIG. 3 is a sectional view taken along the line I-I' of FIG. 2.
Figure 4:
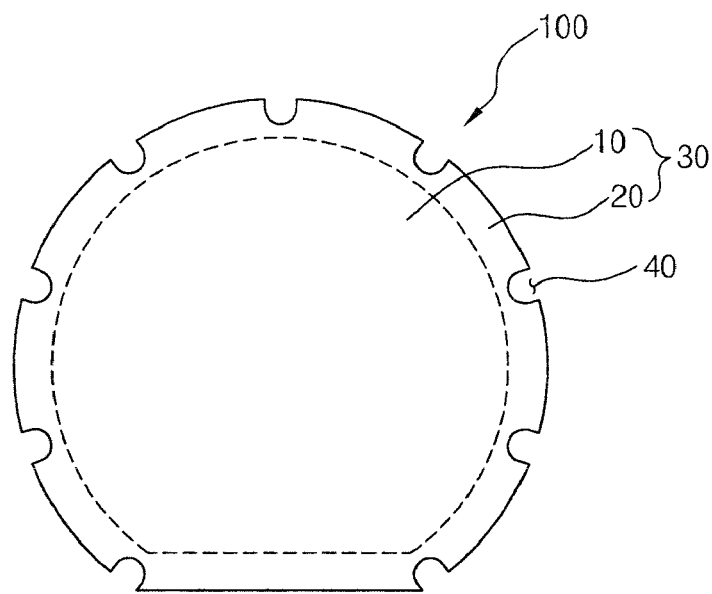
FIG. 4 is a plan view illustrating a variation of the stress dispersion parts shown in FIG. 2.

FIG. 2 is a plan view illustrating a wafer in accordance with an embodiment of the present invention. FIG. 3 is a sectional view taken along the line I-I' of FIG. 2. FIG. 4 is a plan view illustrating a variation of the stress dispersion parts shown in FIG. 2.

Referring to FIG. 2, a wafer 100 has a substantially disc-shaped outer appearance. In the present embodiment, the wafer 100 having the shape of a disc can be a silicon wafer which contains a small amount of conductive impurities and has the characteristics of a semiconductor.

The wafer 100 having the shape of a disc includes a wafer body 30 and stress dispersion parts 40.

The wafer body 30 has a semiconductor chip forming zone 10 and a peripheral zone (or a flat zone) 20.

The semiconductor chip forming zone 10 can include semiconductor chips which have semiconductor elements formed through a semiconductor element forming process, etc., and the peripheral zone 20 is located around (or at the periphery of) the semiconductor chip forming zone 10. The semiconductor chips including the semiconductor elements are not formed in the peripheral zone 20.

When grinding the rear surface of the wafer body 30 having the semiconductor chip forming zone 10 and the peripheral zone 20, for example, through a grinding process, excessive stress is likely to be build up within the wafer body 30. Due to this fact, the wafer body 30 is more prone to being warped and/or subsequently broken.

In order to efficiently disperse and/or absorb the stress induced in the ground down wafer body 30 and thereby prevent the ground down wafer body 30 from being warped and/or breaking due to the stress, the stress dispersion parts 40 are located in the peripheral zone 20 of the wafer body 30.

Referring to FIGS. 2 and 3, the stress dispersion parts 40 can have openings which are defined to be concave from the edge of the peripheral zone 20 toward the semiconductor chip forming zone 10. In the present embodiment, the stress dispersion parts 40 are formed to pass through the upper surface and the lower surface, that is, the rear surface, of the wafer body 30.

The stress dispersion parts 40 for dispersing and/or absorbing the stress induced in the wafer body 30 can have a variety of shapes when viewed from the top.

For example, each of the stress dispersion parts 40 can have a V-shaped opening having a pointed end, when viewed from the top.

Referring to FIG. 4, each of the stress dispersion parts 40 for dispersing and/or absorbing the stress induced in the wafer body 30 can have a U-shaped opening having a rounded end, when viewed from the top. Besides, each of the stress dispersion parts 40 can have polygonal openings when viewed from the top.

In order to more efficiently disperse and/or absorb the stress induced in the wafer body 30, the stress dispersion parts 40 can be located at substantially regular intervals along the edge of the peripheral zone 20. Unlike this, the stress dispersion parts 40 can be located to be bilaterally symmetric about the center of the wafer body 30. In the present embodiment, the stress dispersion parts 40 may be located in the peripheral zone 20 of the wafer body 30 at the number of 2 to 10.

When the stress dispersion parts 40 are located at substantially regular intervals along the edge of the peripheral zone 20 or to be bilaterally symmetric about the center of the wafer body 30, it is possible to further prevent or at least minimize warpage or breakage from occurring in a portion of the wafer body 30.

Referring again to FIG. 3, the thickness T of the wafer body 30 having the stress dispersion parts 40 can be, for example, about 300 μm to about 1,000 μm. That is to say, the stress dispersion parts 40 can be formed in advance on the wafer body 30 before the rear surface of the wafer body 30 is thinned through a grinding process.

Meanwhile, the thickness T of the wafer body 30 having the stress dispersion parts 40 can be, for example, about 30 μm to about 100 μm.

Figure 1:
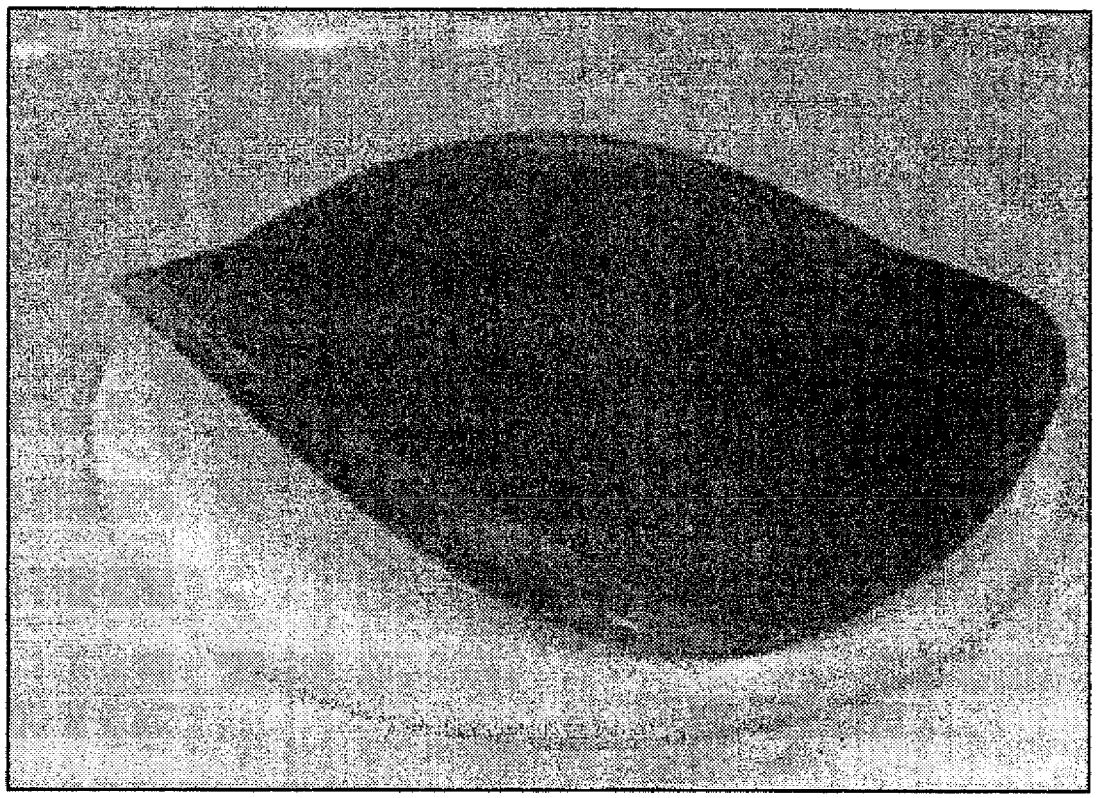
FIG. 1 is a photograph illustrating a conventional wafer which is formed with semiconductor chips that was ground down on the rear surface showing warpage thereof.

If the stress dispersion parts 40 are not formed on the wafer body 30 having the thickness of about 30 μm to about 100 μm, warpage and/or twisting can occur in the wafer body 30 as shown in FIG. 1. However, when the stress dispersion parts 40 are formed on the wafer body 30, warpage and/or twisting does not occur in the wafer body 30 having the thickness of about 30 μm to about 100 μm.

Figure 5:
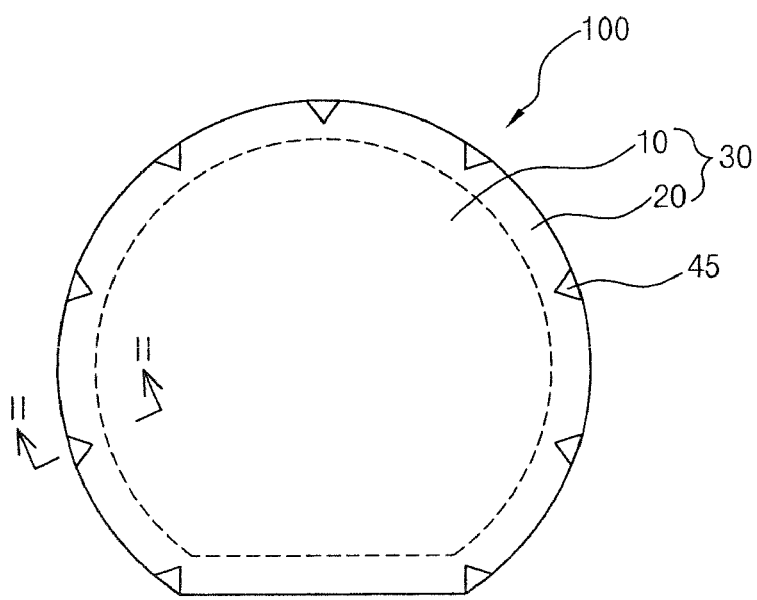
FIG. 5 is a plan view illustrating a wafer in accordance with another embodiment of the present invention.
Figure 6:
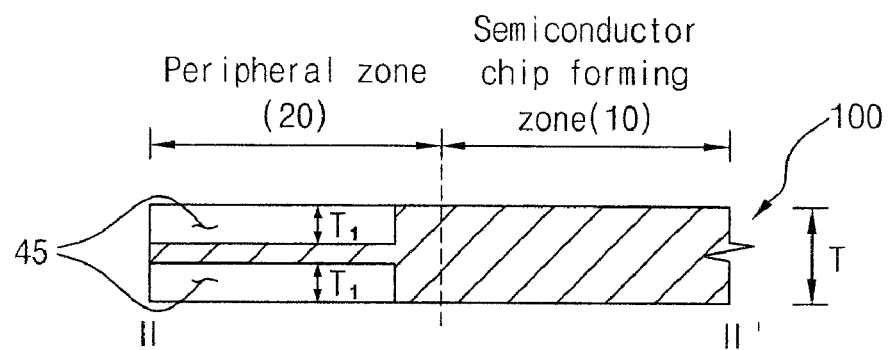
FIG. 6 is a sectional view taken along the line II-II' of FIG. 5.
Figure 7:
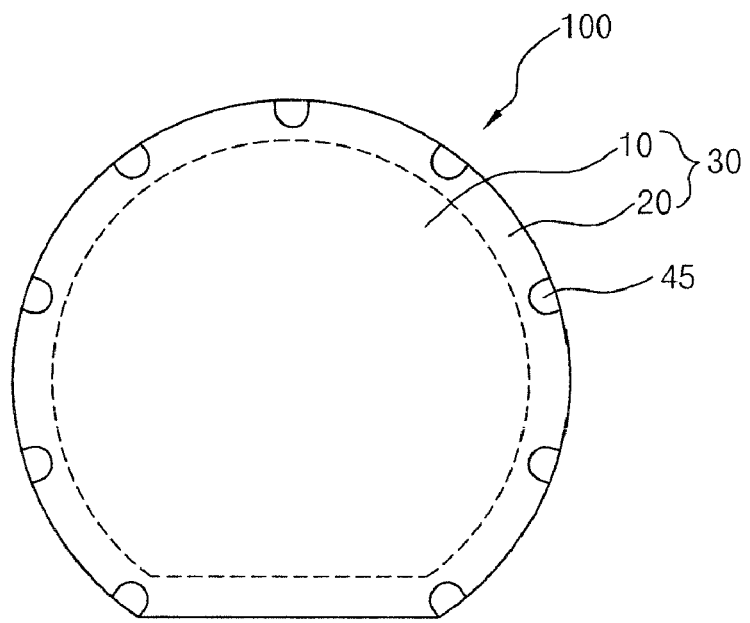
FIG. 7 is a plan view illustrating a variation of the stress dispersion parts shown in FIG. 5.

FIG. 5 is a plan view illustrating a wafer in accordance with another embodiment of the present invention. FIG. 6 is a sectional view taken along the line II-II' of FIG. 5. FIG. 7 is a plan view illustrating a variation of the stress dispersion parts shown in FIG. 5.

Referring to FIG. 5, a wafer 100 has a substantially disc-shaped outer appearance. In the present embodiment, the wafer 100 having the shape of a disc can be a silicon wafer which contains a small amount of conductive impurities and has the characteristics of a semiconductor.

The wafer 100 having the shape of a disc includes a wafer body 30 and stress dispersion parts 45.

The wafer body 30 has a semiconductor chip forming zone 10 and a peripheral zone (or a flat zone) 20.

Semiconductor chips, which have semiconductor elements formed through a semiconductor element forming process, etc., are formed in the semiconductor chip forming zone 10, and the peripheral zone 20 is located around (or at the periphery of) the semiconductor chip forming zone 10. The semiconductor chips including the semiconductor elements are preferably not formed in the peripheral zone 20.

When grinding the rear surface of the wafer body 30 having the semiconductor chip forming zone 10 and the peripheral zone 20, for example, through the grinding process, excessive stress is likely to be induced in the wafer body 30, and due to this fact, the wafer body 30 can be warped and/or break.

In order to efficiently disperse and/or absorb the stress induced in the wafer body 30 and thereby prevent or at least minimizing the wafer body 30 from being warped and/or breaking due to the stress, the stress dispersion parts 45 are located in the peripheral zone 20 of the wafer body 30.

Referring to FIGS. 5 and 6, the stress dispersion parts 45 can have recesses or grooves which are defined to be concave from the edge of the peripheral zone 20 toward the semiconductor chip forming zone 10. In the present embodiment, the stress dispersion parts 45 having recess shapes are formed on the upper surface and the lower surface. That is, the rear surface, of the wafer body 30, such that the depth T1 of the stress dispersion parts 45 is less than the thickness T of the wafer body 30. In detail, the depth T1 of the stress dispersion parts 45 formed on the upper surface and the lower surface of the wafer body 30 can be less than one half of the thickness T of the wafer body 30.

The stress dispersion parts 45 for dispersing and/or absorbing the stress induced in the wafer body 30 can have a variety of shapes when viewed from the top.

For example, each of the stress dispersion parts 45 can have a V-shaped groove having a pointed end, when viewed from the top.

Referring to FIG. 7, each of the stress dispersion parts 45 for dispersing and/or absorbing the stress induced in the wafer body 30 can have a U-shaped groove having a rounded end, when viewed from the top. Besides, each of the stress dispersion parts 45 can have polygonal grooves when viewed from the top.

In order to more efficiently disperse and/or absorb the stress induced in the wafer body 30, the stress dispersion parts 45 can be located at substantially regular intervals along the edge of the peripheral zone 20. Unlike this, the stress dispersion parts 45 can be located to be bilaterally symmetric about the center of the wafer body 30. In the present embodiment, the stress dispersion parts 45 may be located in the peripheral zone 20 of the wafer body 30 and may comprise 2 to 10 stress dispersion parts.

When the stress dispersion parts 45 are located at substantially regular intervals along the edge of the peripheral zone 20 or to be bilaterally symmetric about the center of the wafer body 30, it is possible to further prevent or minimize warpage or breakage from occurring in a portion of the wafer body 30.

Figure 8:
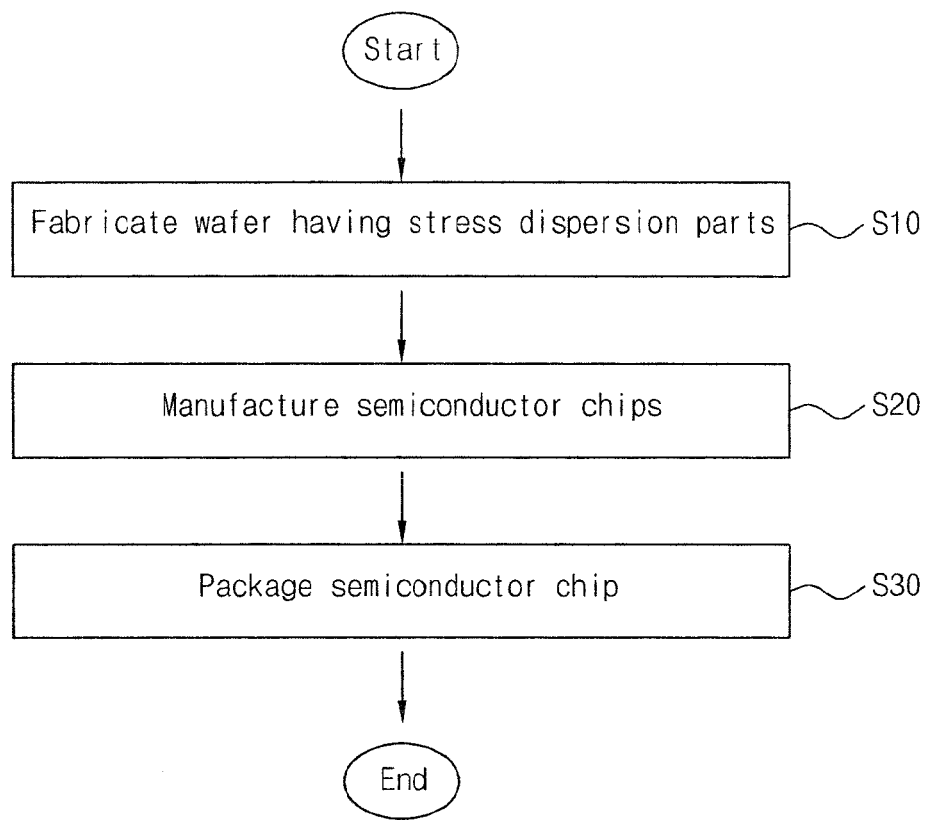
FIG. 8 is a flow chart illustrating a method for manufacturing a semiconductor package in accordance with still another embodiment of the present invention.
Figure 9:
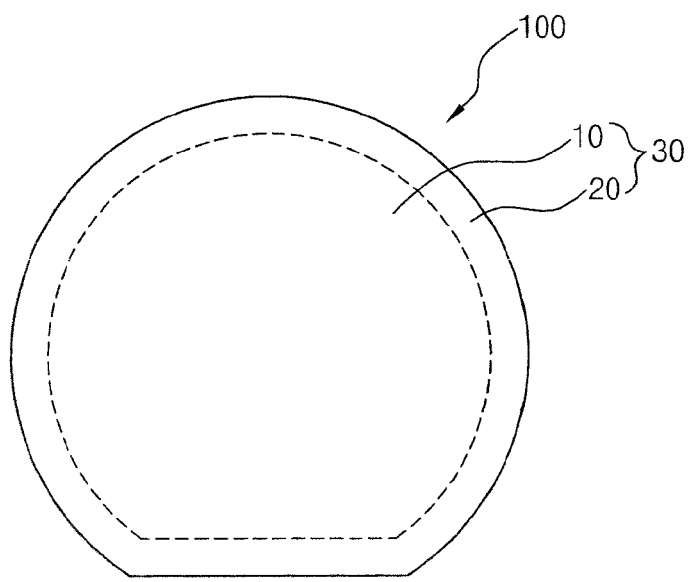
FIG. 9 is a plan view illustrating a wafer used for manufacturing a semiconductor package.

FIG. 8 is a flow chart illustrating a method for manufacturing a semiconductor package in accordance with still another embodiment of the present invention. FIG. 9 is a plan view illustrating a wafer used for manufacturing a semiconductor package.

Referring to FIGS. 8 and 9, in order to manufacture a semiconductor package, a wafer having stress dispersion parts is fabricated in step S10.

In order to fabricate the wafer, a wafer 100 is first prepared. The wafer 100 can, for example, be a silicon wafer. The wafer 100 includes a wafer body 30 which has a semiconductor chip forming zone 10 where semiconductor chips are to be formed as will be described later and a peripheral zone 20 located around the semiconductor chip forming zone 10. In the present embodiment, the thickness of the wafer body 30 can be about 300 μm to about 1,000 μm.

Figure 10:
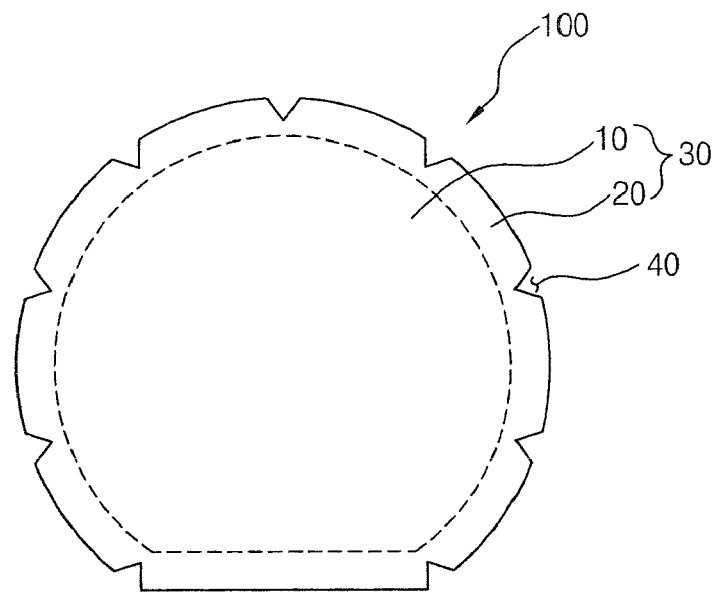
FIG. 10 is a plan view illustrating a state in which stress dispersion parts are formed on the wafer shown in FIG. 9.

FIG. 10 is a plan view illustrating a state in which stress dispersion parts are formed on the wafer shown in FIG. 9.

Referring to FIG. 10, after the wafer 100 is prepared, stress dispersion parts 40 are formed in the peripheral zone 20 of the wafer 100. The stress dispersion parts 40 function to efficiently disperse and/or absorb the excessive stress induced during implementation of a semiconductor chip manufacturing process and/or a grinding process for grinding the rear surface of the wafer 100, as will be described later, and to prevent or minimize the wafer 100 from being warped and/or twisted.

The stress dispersion parts 40, which are located in the peripheral zone 20 of the wafer 100, are formed, for example, through a grinding process or a photolithographic process.

The stress dispersion parts 40, which are formed through the grinding process or the photolithographic process, can have the sectional shape of a 'V' which is defined from the edge of the peripheral zone 20 toward the semiconductor chip forming zone 10, when viewed from the top. Unlike this, the stress dispersion parts 40 can have the sectional shape of a 'U' which is defined from the edge of the peripheral zone 20 toward the semiconductor chip forming zone 10, when viewed from the top.

Meanwhile, the stress dispersion parts 40 having the sectional shape of a 'V' or a 'U' can have openings which pass through the peripheral zone 20, so as to efficiently disperse and/or absorb the stress induced in the wafer 100. Unlike this, the stress dispersion parts 40 having the sectional shape of a 'V' or a 'U' can have recesses or grooves which are defined on the upper and lower surfaces of the peripheral zone 20, so as to efficiently disperse and/or absorb the stress induced in the wafer 100.

In the present embodiment, the stress dispersion parts 40 having the sectional shape of a 'V' or a 'U' can be formed at regular intervals along the peripheral zone 20. Unlike this, the stress dispersion parts 40 can be located to be bilaterally symmetric about the center of the wafer 100.

Figure 11:
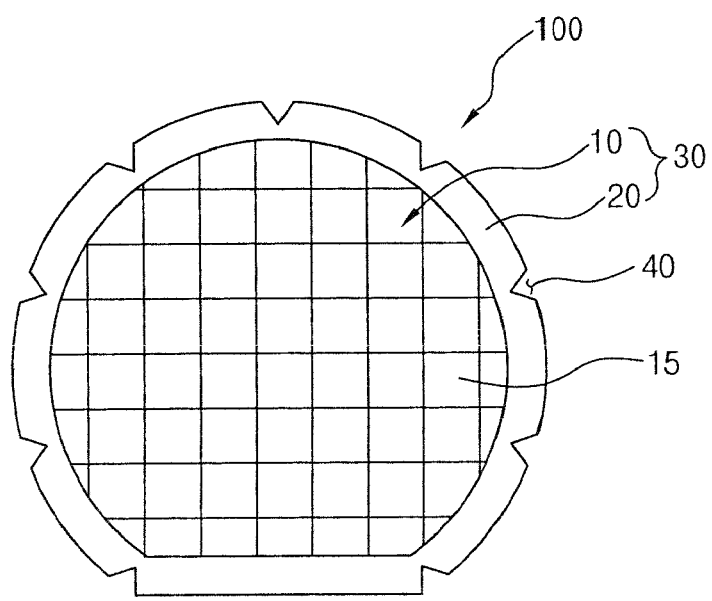
FIG. 11 is a plan view illustrating a state in which semiconductor chips are formed in the semiconductor chip forming zone of the wafer shown in FIG. 10.

FIG. 11 is a plan view illustrating a state in which semiconductor chips are formed in the semiconductor chip forming zone of the wafer shown in FIG. 10.

Referring to FIGS. 8 and 11, after the wafer 100 is fabricated to have the stress dispersion parts 40, in step S20, semiconductor chips 15 are formed on the wafer 100 through a semiconductor element manufacturing process.

Figure 12:
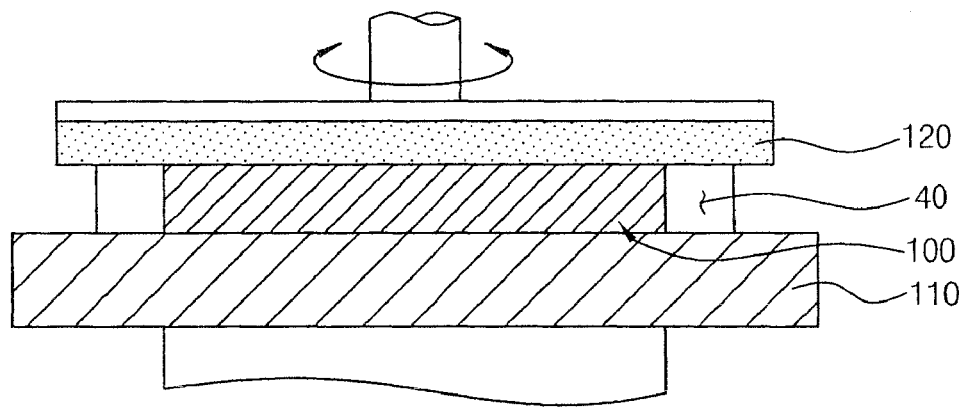
FIG. 12 is a sectional view illustrating a process of grinding the rear surface of the wafer formed in FIG. 11.

FIG. 12 is a sectional view illustrating a process of grinding the rear surface of the wafer formed in FIG. 11.

Referring to FIG. 12, after the semiconductor chips 15 are formed in the semiconductor chip forming zone 10 of the wafer 100, the rear surface of the wafer 100 is thinned through a grinding process, and the thickness of the wafer 100 decreases. In the present embodiment, the thickness of the ground down wafer 100 is about 30 μm to about 100 μm.

In FIG. 12, the reference numeral 110 designates a fastening table for fastening the wafer 100 having the stress dispersion parts 40, and the reference numeral 120 designates a grinding member for grinding the rear surface of the wafer 100.

Even though stress is excessively induced in the wafer 100 which is thinned to the thickness of about 30 μm to about 100 μm, the stress excessively induced in the wafer 100 is dispersed and/or absorbed by the stress dispersion parts 40, and warpage and/or twisting is less likely to occur in the wafer 100.

Figure 13:
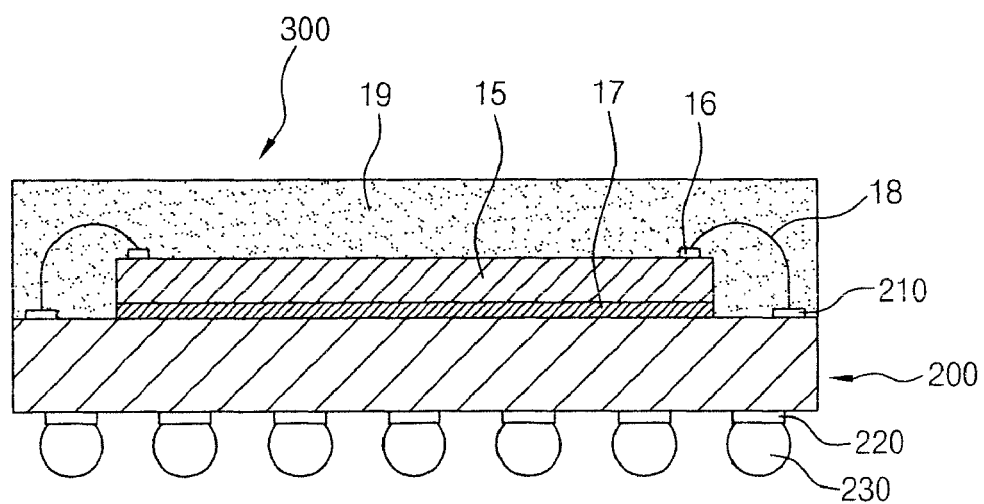
FIG. 13 is a sectional view illustrating a state in which a semiconductor chip parted from the wafer thinned in FIG. 12 is packaged.

FIG. 13 is a sectional view illustrating a state in which a semiconductor chip parted from the wafer thinned in FIG. 12 is packaged.

Referring to FIG. 13, the semiconductor chips 15 of the wafer 100, which are thinned through the grinding process as shown in FIG. 12 and have a decreased thickness, are parted from the wafer 100 through a sawing process.

The parted semiconductor chip 15 is attached, for example, to a substrate 200 such as a printed circuit board, using an adhesive material 17. Bonding pads 16 are formed on the upper surface of the semiconductor chip 15, and connection pads 210 to be electrically connected with the bonding pads 16 are formed on the upper surface of the substrate 200. The connection pads 210 and the bonding pads 16 are electrically bonded to each other, for example, by conductive wires 18.

Then, a molding member 19 covers the conductive wires 18 and the semiconductor chip 15 to insulate the semiconductor chip 15 and protect the semiconductor chip 15 from externally applied shocks and/or vibrations.

Thereupon, solder balls 230 are connected to ball lands 220 which are formed on the lower surface of the substrate 200, facing away from the upper surface, whereby the manufacture of a semiconductor package 300 is completed.

In the present embodiment shown in FIGS. 8 through 13, it was described and illustrated that the stress dispersion parts 40 are formed in the peripheral zone 20 of the wafer 100 and the rear surface of the wafer 100 is thinned before forming the semiconductor chips 15 in the semiconductor chip forming zone 10 of the wafer 100. However, unlike this, it can be envisaged that the rear surface of the wafer 100 can be thinned after the semiconductor chips 15 are formed in the semiconductor chip forming zone 10 of the wafer 100 and the stress dispersion parts 40 are formed in the peripheral zone 20 of the wafer 100. As in accordance to step S30, the package semiconductor chip may be prepared.

As is apparent from the above description, in the present invention, due to the fact that stress dispersion parts for dispersing and/or absorbing stress are formed in the peripheral zone of a wafer such as a wafer to be formed with semiconductor chips, the stress induced in the wafer by a process for grinding the rear surface of the wafer, etc. can be efficiently dispersed and/or absorbed, whereby it is possible to prevent the wafer from being warped and/or twisted.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A wafer comprising:
    a wafer body having a semiconductor chip forming zone and a peripheral zone located around the semiconductor chip forming zone; and
    stress dispersion parts which are defined to be concave from an edge of the peripheral zone toward the semiconductor chip forming zone so as to disperse stress induced in the peripheral zone and the semiconductor chip forming zone.

2. The wafer according to claim 1, wherein the stress dispersion parts comprise openings.

3. The wafer according to claim 2, wherein the stress dispersion parts comprise the sectional shape of a 'V' having a pointed end, when viewed from the top.

4. The wafer according to claim 2, wherein the stress dispersion parts comprise the sectional shape of a 'U' having a rounded end, when viewed from the top.

5. The wafer according to claim 1, wherein the stress dispersion parts are located at substantially regular intervals along the peripheral zone.

6. The wafer according to claim 1, wherein the stress dispersion parts comprise recesses.

7. The wafer according to claim 6, wherein the recesses are defined on a first surface and a second surface, facing away from the first surface, of the wafer body that are aligned up and down with respect to the first and second surfaces.

8. The wafer according to claim 1, wherein the stress dispersion parts are located along the peripheral zone and comprise 2 to 10 stress dispersion parts.

9. A method for manufacturing a semiconductor package, comprising the steps of:
    preparing a wafer by forming stress dispersion parts which are defined to be concave from an edge of the peripheral zone toward the semiconductor chip forming zone, in a peripheral zone of the wafer body which has a semiconductor chip forming zone and the peripheral zone formed around the semiconductor chip forming zone;
    manufacturing a semiconductor chip by parting the semiconductor chip forming zone from the wafer body; and
    packaging the semiconductor chip.

10. The method according to claim 9, wherein, between the step of forming the stress dispersion parts and the step of parting the semiconductor chip, the method further comprises the step of grinding a rear surface of the wafer body.

11. The method according to claim 9, wherein the stress dispersion parts have the sectional shape of a 'V' or a 'U' when viewed from the top.

12. The method according to claim 9, wherein, in the step of forming the stress dispersion parts, the stress dispersion parts are formed at substantially regular intervals along the peripheral zone.

13. The method according to claim 9, wherein, in the step of forming the stress dispersion parts, the stress dispersion parts are comprised of openings.

14. The method according to claim 9, wherein the step of forming the stress dispersion parts, the stress dispersion parts are comprised of recesses.

* * * * *